(12) United States Patent
Chou et al.

(10) Patent No.: US 7,887,739 B2
(45) Date of Patent: Feb. 15, 2011

(54) METHODS AND APPARATUS OF PRESSURE IMPRINT LITHOGRAPHY

(76) Inventors: Stephen Y. Chou, 7 Foulet Dr., Princeton, NJ (US) 08540; Wei Zhang, 88 Cypress Pl., Newtown, PA (US) 18940

( * ) Notice: Subject to any disclaimer, the term of this patent is extended or adjusted under 35 U.S.C. 154(b) by 0 days.

(21) Appl. No.: 11/928,844

(22) Filed: Oct. 30, 2007

(65) Prior Publication Data
US 2008/0106003 A1    May 8, 2008

Related U.S. Application Data

(60) Continuation of application No. 10/445,578, filed on May 27, 2003, now abandoned, which is a continuation-in-part of application No. 10/244,276, filed on Sep. 16, 2002, which is a continuation-in-part of application No. 10/046,594, filed on Oct. 29, 2001, now abandoned, which is a division of application No. 09/107,006, filed on Jun. 30, 1998, now Pat. No. 6,309,580, which is a continuation of application No. 08/558,809, filed on Nov. 15, 1995, now Pat. No. 5,772,905, said application No. 10/445,578 is a continuation-in-part of application No. 10/140,140, filed on May 7, 2002, now Pat. No. 7,137,803, which is a division of application No. 09/618,174, filed on Jul. 18, 2000, now Pat. No. 6,482,742.

(51) Int. Cl.
*B29C 43/36* (2006.01)
*B29C 43/56* (2006.01)

(52) U.S. Cl. .......... 264/402; 264/479; 264/480; 264/320; 425/3; 425/174; 425/406

(58) Field of Classification Search .......... 264/402, 264/320, 1.1, 2.7, 479, 480, 405; 425/174, 425/406, 3, 407
See application file for complete search history.

(56) References Cited

U.S. PATENT DOCUMENTS

| 2,951,437 | A | * | 9/1960 | Diener | 100/256 |
| 4,703,644 | A | * | 11/1987 | Waldner | 72/430 |
| 4,731,155 | A | * | 3/1988 | Napoli et al. | 216/44 |
| 6,482,742 | B1 | * | 11/2002 | Chou | 438/690 |

* cited by examiner

*Primary Examiner*—Mathieu D. Vargot
(74) *Attorney, Agent, or Firm*—Polster, Lieder, Woodruff & Lucchesi, LC

(57) ABSTRACT

An improved method of imprint lithography involves using fluid-induced pressure from electric or magnetic fields to press a mold onto a substrate having a moldable surface. In essence, the method comprises the steps of providing a substrate having a moldable surface, providing a mold having a molding surface and pressing the molding surface and the moldable surface together by electric or magnetic fields to imprint the molding surface onto the moldable surface. The molding surface advantageously comprises a plurality of projecting features of nanoscale extent or separation, but the molding surface can also be a smooth planar surface, as for planarization. The improved method can be practiced without mechanical presses and without sealing the region between the mold and the substrate.

19 Claims, 4 Drawing Sheets

METHODS AND APPARATUS OF PRESSURE IMPRINT LITHOGRAPHY

CROSS-REFERENCE TO RELATED APPLICATIONS

This application is a continuation of U.S. patent application Ser. No. 10/445,578 filed by Stephen Y. Chou, et al. on May 27, 2003.

The '578 patent claims the benefit of U.S. Provisional Patent Application Ser. No. 60/382,961 filed by Stephen Y. Chou and Wei Zhang on May 24, 2002 and entitled "Field-Induced Pressure Imprint Lithography".

The '578 application is also a continuation-in-part of U.S. patent application Ser. No. 10/244,276 filed by Stephen Chou on Sep. 16, 2002 and entitled "Lithographic Method For Molding Pattern With Nanoscale Features" which, in turn, is a continuation of U.S. application Ser. No. 10/046,594 filed by Stephen Y. Chou on Oct. 29, 2001, is a divisional of, and claims priority to U.S. patent application Ser. No. 09/107,006 filed by Stephen Y. Chou on Jun. 30, 1998 (now U.S. Pat. No. 6,309,580 issued Oct. 30, 2001) and which, is a continuation of, and in turn, claims priority to U.S. application Ser. No. 08/558,809 filed by Stephen Y. Chou on Nov. 15, 1995 (now U.S. Pat. No. 5,772,905 issued Jun. 30, 1998). All of the foregoing Related Applications are incorporated herein by reference.

The '578 patent application is also a continuation-in-part of U.S. patent application Ser. No. 10/140,140 filed by Stephen Y. Chou on May 7, 2002 entitled "Fluid Pressure Imprint Lithography" which is a divisional of U.S. patent application Ser. No. 09/618,174 filed by Stephen Y. Chou on Jul. 18, 2000 and entitled "Fluid Pressure Imprint Lithography" (now U.S. Pat. No. 6,482,742).

Each of the applications and patents listed above are incorporated herein by reference.

STATEMENT REGARDING FEDERALLY SPONSORED RESEARCH

Not Applicable.

FIELD OF THE INVENTION

This invention relates to imprint lithography and, in particular, to imprint lithography wherein electrical or magnetic fields are used to imprint a molding surface onto a moldable surface. The process is particularly useful to provide nanoimprint lithography of enhanced resolution and uniformity over an increased area.

BACKGROUND OF THE INVENTION

Photolithography is a key process in the fabrication of semiconductor integrated circuits and many optical, magnetic and micromechanical devices. Lithography creates a pattern on a thin film carried on a substrate so that, in subsequent process steps, the pattern can be replicated in the substrate or in another material which is added onto the substrate. Conventional lithography typically involves applying a thin film of resist to a substrate, exposing the resist to a desired pattern of radiation, and developing the exposed film to produce a physical pattern. In this approach, resolution is limited by the wavelength of the radiation, and the equipment becomes increasingly expensive as the feature size becomes smaller.

Imprint lithography, based on a fundamentally different principle, offers high resolution, high throughput, low cost and the potential of large area coverage. In imprint lithography, a mold with microscale or nanoscale features is pressed into a thin film, deforming the shape of the film according to the features of the mold and forming a relief pattern in the film. After the mold is removed, the thin film can be processed to remove the reduced thickness portions. This removal exposes the underlying substrate for further processing. Details of imprint lithography are described in applicant's U.S. Pat. No. 5,772,905 issued Jun. 30, 1998 and entitled "Nanoimprint Lithography". The '905 patent is incorporated herein by reference.

The usual method of pressing the mold into the thin film involves positioning the mold and the substrate on respective rigid plates of a high precision mechanical press. With such apparatus, the process can generate sub-25 nm features with a high degree of uniformity over areas on the order of 12 in$^2$. Larger areas of uniformity would be highly advantageous to increase throughput and for many applications such as displays.

The use of a high precision mechanical press to press a mold into a thin film presents tolerance problems in replicating small patterns over large areas. Presses move on guide shafts through apertures, and the spacings between the shafts and their respective apertures can be large compared to the features to be replicated. Such spacings permit undesirable relative translational and rotational shifts between the substrate and the mold. Moreover, despite the most careful construction, the molds and the substrates used in lithography are not perfectly planar. When these molds and substrates are disposed on the rigid plates of a press, the deviations from planarity over large areas can result in variations in the molding pressure and depth of imprint. Accordingly, it is desirable to provide a method of imprint lithography which avoids the limitations of mechanical presses.

An alternative method of pressing the mold into the thin film is the technique of fluid pressure imprint lithography described in applicant's U.S. Pat. No. 6,482,742 issued Nov. 19, 2002 and entitled "Fluid Pressure Imprint Lithography". In this method the molding surface is disposed adjacent the film, the molding surface/film interface is sealed and pressurized fluid is used to force the molding surface into the film. Since the pressure is isostatic, translational and rotational shifts are minimal, and smaller features can be imprinted with high uniformity over larger areas than can be imprinted using mechanical presses.

Fluid pressure imprinting has dramatically improved nanoimprint lithography. A further improvement for commercial manufacture would be a method which could provide comparable results without the necessity of sealing the molding surface/film interface.

BRIEF SUMMARY OF THE INVENTION

An improved method of imprint lithography involves using field-induced pressure from electric or magnetic fields to press a mold into a substrate having a moldable surface. In essence, the method comprises the steps of providing a substrate having a moldable surface, providing a mold having a molding surface and pressing the molding surface and the moldable surface together by electric or magnetic fields to imprint the molding surface onto the moldable surface. The molding surface advantageously comprises a plurality of projecting features of nanoscale extent or separation, but the molding surface can also be a smooth planar surface, as for planarization. The improved method can be practiced without mechanical presses and without sealing the region between the mold and the substrate.

BRIEF DESCRIPTION OF THE SEVERAL VIEWS OF THE DRAWINGS

The advantages, nature and various additional features of the invention will appear more fully upon consideration of the illustrative embodiments now to be described in detail in connection with the accompanying drawings. In the drawings.

It is to be understood that these drawing are for purposes of illustrating the concepts of the invention and are not to scale.

DETAILED DESCRIPTION OF THE INVENTION

Figure 1:
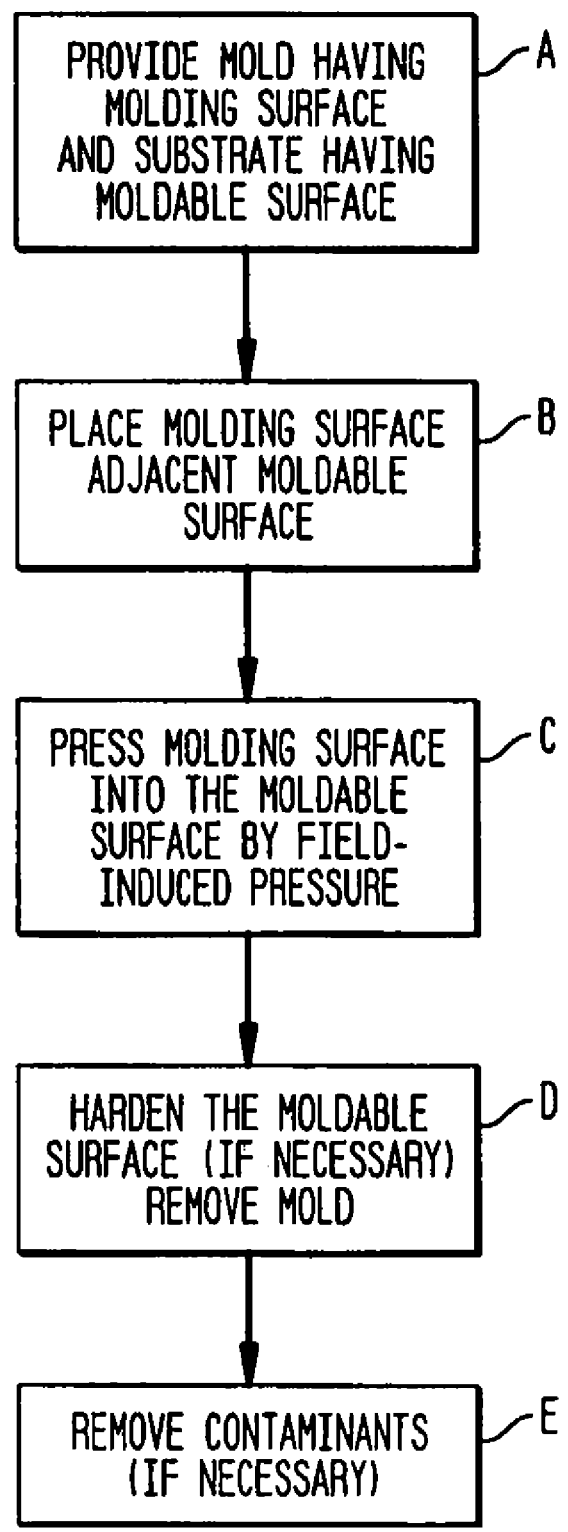
FIG. 1 is a schematic flow diagram of the steps in an improved method of imprint lithography.

Referring to the drawings, FIG. 1 is a schematic flow diagram of an improved process for imprint lithography using field-induced pressure. An initial step shown in Block A, is to provide a mold having a molding surface such as plurality of protruding features and a substrate having a surface of moldable material such as one or more moldable thin films. Protruding features are preferably micrometer scale features and, more advantageously, nanoscale features. The method is highly advantageously where the mold surface has at least two spaced apart protruding features. A moldable material is one which retains or can be hardened to retain the imprint of the protruding features from the mold surface.

The next step, shown in Block B, is to place the mold adjacent the moldable surface. If the moldable surface is a thin film that already includes a previously formed pattern, then the pattern of the mold should be carefully aligned with the previous pattern. This can be done by alignment techniques well known in the art.

The third step (Block C) is to press the mold onto the moldable surface by field-induced pressure. One method for doing this is to dispose the assembly between conductive layers and apply an electrical field between the layers. Another approach is to dispose the assembly between layers of magnetic material and to apply a magnetic field that will force the layers together. The advantage of field-induced pressure is that the resulting force uniformly pushes the mold onto the moldable surface. Shear or rotational components are de minimus. Moreover since the mold and/or substrate are flexible rather than rigid, conformation between the mold and the moldable surface is achieved regardless of unavoidable deviations from planarity. The result is an enhanced level of molding resolution, alignment and uniformity over an increased area of the film.

The next step shown in Block D, is to harden the moldable surface, if necessary, so that it retains the imprint of the mold and then to remove the mold. The process for hardening depends on the material of the moldable surface. Some materials will maintain the imprint with no hardening. Thermoplastic materials can be hardened by preliminarily heating them prior to molding and permitting them to cool after imprint. PMMA, for example, can be suitably softened by heating to 120° C. prior to molding and hardened by cooling after imprint. Heat curable materials can be hardened by applying heat during imprint. A heater and/or the use of a heated pressurized fluid can thus effectuate such softening or hardening. Radiation curable materials can be hardened by the application of UV radiation during imprint. Silicon can be softened by UV laser radiation to accept imprinting and hardened by cooling to ambient temperature.

The fifth step shown in Block E is optional in some applications. It is to remove contaminants (if any) and excess material from the recesses of the molded surface. The molded surface will typically have raised features and recesses. In many lithographic operations it is desirable to eliminate the material from the recesses so that the underlying substrate is exposed for further processing. This can be conveniently accomplished using reactive ion etching.

In some applications, the imprinted structure itself is a part of a device to be built. In other applications the resulting structure is a resist-covered semiconductor substrate with a pattern of recesses extending toward the substrate. Such a structure can be further processed in a variety of ways well-known in the art. For example, the molded film can be used as a mask for the removal of surface layers in exposed regions of the substrate, for doping exposed regions of the substrate or for growing or depositing materials on the exposed regions.

Figure 2:
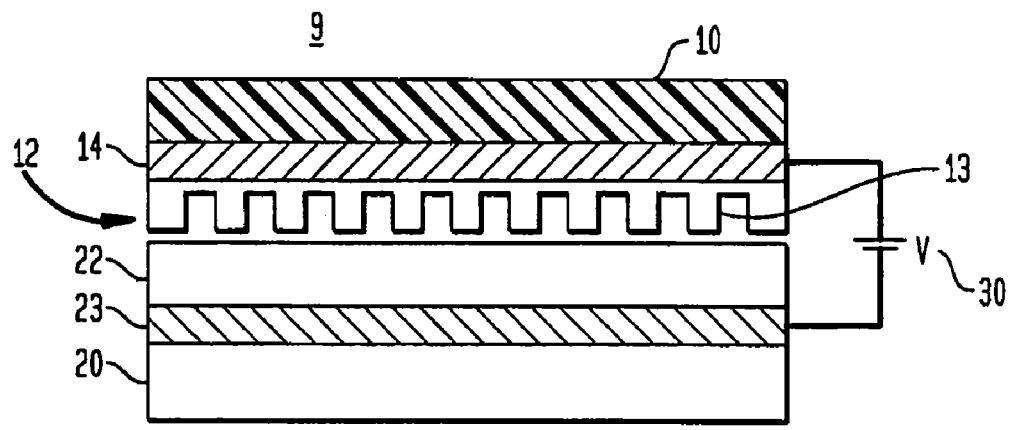
FIG. 2 illustrates apparatus for practicing the method of FIG. 1 using an electrical field.

FIG. 2 schematically illustrates a first exemplary apparatus 9 for practicing the method of FIG. 1. The apparatus 9 comprises an assembly of a mold 10 having a molding surface 12 and a substrate 20 having a moldable surface 22. The mold and substrate are disposed with the molding surface 12 adjacent the moldable surface 22. The mold 10 comprises a body having a molding surface 12. Surface 12 can include a plurality of protruding features 13 having a desired shape for imprinting onto the moldable surface 22. The molding surface 12 can be patterned into protruding features 13 of nanoscale dimensions by known techniques such as electron beam lithography. The projecting extent of the protruding features 13 is typically in the range 0.1 nm to 200 μm. Typical separations between protruding features are 200 nanometers or less. Advantageously the mold 10 is a multilayer structure comprising a layer of conductive or chargeable material that is distal to the interface between the molding surface and the moldable surface. The term layer as used herein is intended broadly to cover a supported layer, a plate or a composite layer.

The substrate 20 is typically a solid substrate and the moldable surface 22 is typically a thin film of polymer, monomer, olgimer or combination thereof that is pliable or can be made pliable to pressure and can retain a pressure-imprinted deformation or pattern. It can be a thermoplastic polymer, such as polycarbonate or polymethyl methacrylate (PMMA), which softens in response to heat. Alternately it can be a monomer liquid, such as a curable silicone, which hardens with curing. Yet further in the alternative, it can be solid silicon which can be liquefied by a UV laser pulse. Polymer thin films are typically applied to the substrate by spraying or spinning. Advantageously the film does not adhere to the mold surface. If necessary, the mold surface can be coated with a release agent to prevent such adherence. Advantageously the substrate is a multilayer structure comprising a layer or plate 23 of conductive or chargeable material that is distal to the molding surface/moldable surface interface. The pressure between the mold and the substrate can be generated by electrical or magnetic forces between the mold and the substrate. For a pressure generated by an electrical force, an attractive electrical field can be established between the mold and the substrate. Alternatively a repulsive field can be used to drive the mold and the substrate together. For a pressure generated by a magnetic force, an attractive magnetic force between the mold and the substrate can provide attractive pressure or repulsive external magnetic forces can drive the mold and the substrate together.

In use, a field forces the molding surface onto the moldable surface. In the embodiment of FIG. 2 where the field is an electric field, this imprinting can be effected by connecting layers 14 and 23 to opposite polarity terminals of a voltage source 30. The voltage from source 30 can be AC, DC, pulsed, or a combination of such voltages.

Figure 3A:
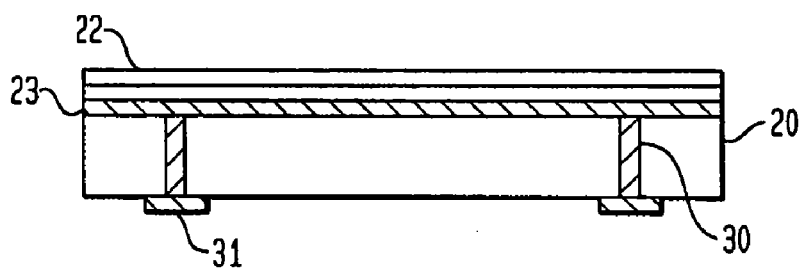
FIGS. 3A, 3B and 3C show various substrate constructions for facilitating electrical contact with a substrate conductive layer.
Figure 3B:
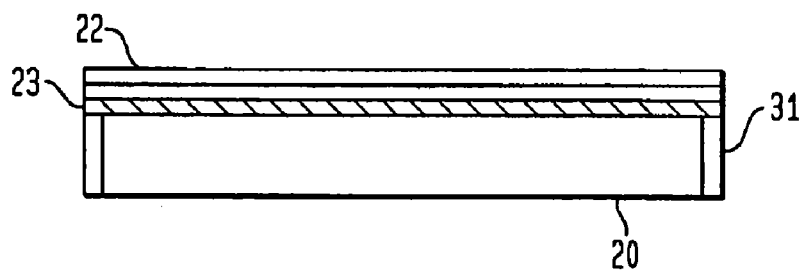
Figure 3C:
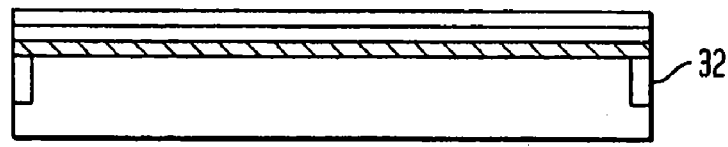

Electrical connection with layers 14 and 23 can be facilitated by choosing substrate 20 to be conductive and mold 10 to be conductive. Alternatively, conductive through holes (not shown) through substrate 20 to layer 23 and through mold 10 to layer 14 can provide connection. FIGS. 3A, 3B and 3C show substrate constructions that facilitate electrical connection with substrate conductive layer 23. In FIG. 3A, electrical contact can be made from the bottom of substrate 20 through conductive vias 30. In FIG. 3B electrical contact can be made from the bottom or from the lateral edges by coating or plating a peripheral layer 31 of conductive material around a portion of the lateral periphery of the substrate 20. A similar peripheral conductive layer 32 is shown in FIG. 3C except that layer 32 does not extend to the bottom of the substrate. Yet further in the alternative, an electric field for imprinting the substrate can be created between appropriately dissimilar materials by the use of light, heat or RF radiation.

In some applications it may be advantageous to make the mold 10 or the substrate 20 (including the conductive layers) of materials at least partially transparent to radiation which can be used to soften or cure the moldable surface.

In other applications it may be desired to omit one of the conductive layers 14, 23 and to use an attractive or repulsive field between an external electrode and the remaining layer to force the molding surface and the moldable surface together.

Figure 4:
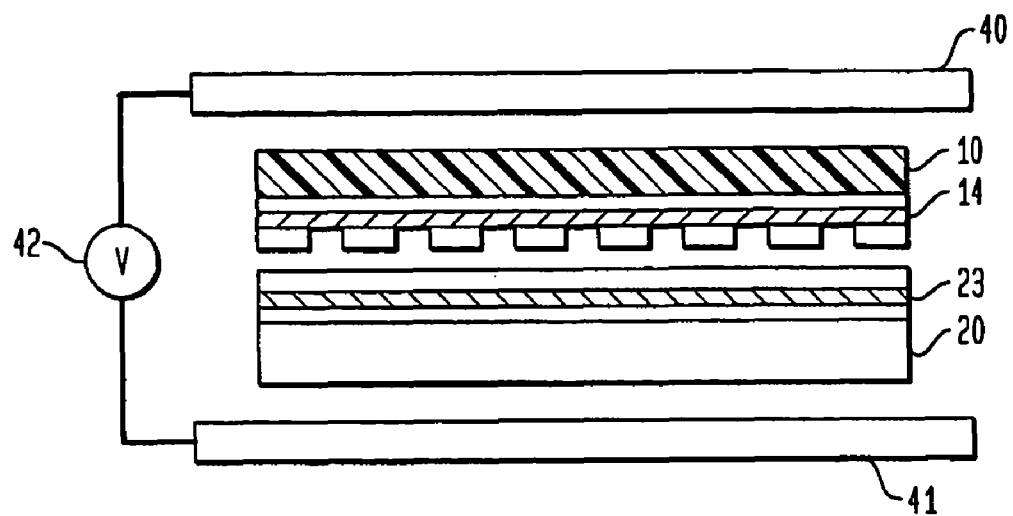
FIG. 4 shows an alternative apparatus for practicing the method of FIG. 1 without direct electrical contact.

FIG. 4 shows an alternative apparatus for using an electrical field to press the molding surface into the moldable surface. The apparatus of FIG. 4 is similar to that of FIG. 2 except that rather than directly connecting the layers 14 and 23 to a voltage source, the mold 10/substrate 20 assembly is disposed between electrodes 40 and 41 that are connected to an AC voltage source 42. The frequency of the AC source can be tuned to generate a desired induced voltage between layers 14 and 23.

Figure 5:
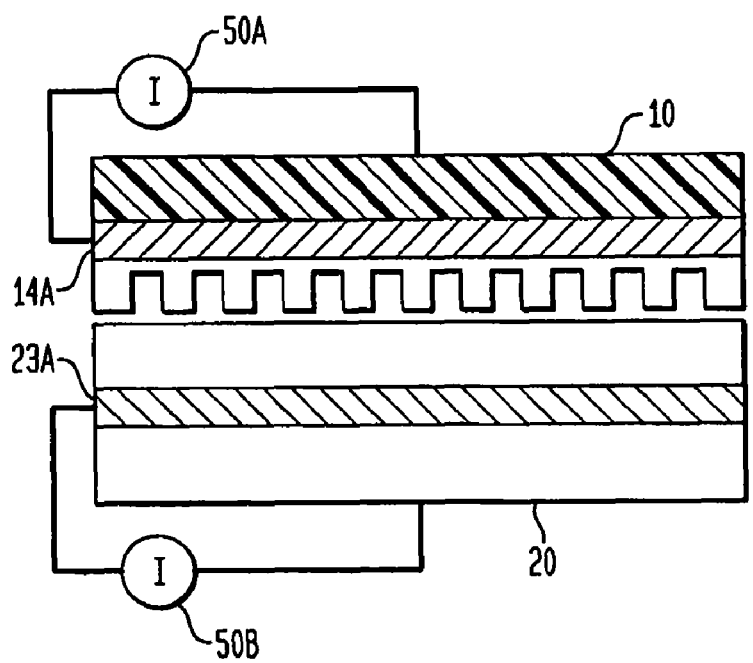
FIG. 5 illustrates apparatus for practicing the method of FIG. 1 using a magnetic field.

FIG. 5 illustrates alternative apparatus for practicing the method of FIG. 1. The FIG. 5 apparatus is similar to the apparatus of FIG. 2 except that instead of conductive layers, magnetic layers 14A, 23A are disposed distal to the mold/substrate interface and a magnetic field is used to imprint the mold surface into the moldable surface. The magnetic layers can be magnetizable material, permanent magnets or electromagnets. For example, layers 14A, 23A can comprise helically or spirally wound coils. Current from current sources 50A, 50B applied to coils can produce an attractive magnetic field to press the molding surface onto the moldable surface. Connections between the current sources and their respective coils can be facilitated by conduction through conductive vias (not shown) in the substrate and the mold. In a modified form, layers 14A and 23A can be magnetic materials that attract one another, and the current sources can be omitted. In another variation, the mold can comprise an electromagnet and the substrate can comprise a layer of magnetizable or permanent magnetic material or vice versa. In essence, what is needed is a magnetic layer and a magnetic field generator interacting with the magnetic layer to press the molding surface and the moldable surface together.

Figure 6A:
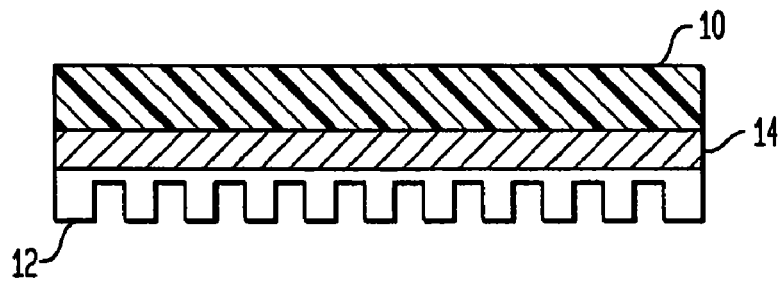
FIGS. 6A and 6B show exemplary multilayer mold constructions useful for the apparatus of FIGS. 2, 4 and 5.
Figure 6B:
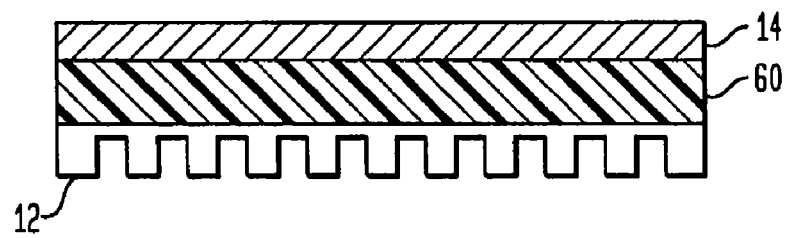

FIGS. 6A and 6B show different multilayer mold constructions useful in the embodiments of FIGS. 2-5. In FIG. 6A, the conductive or magnetic layer 14 is disposed immediately distal to the interface between the molding surface 12 and the moldable surface (not shown). In FIG. 6B, the conductive or magnetic layer 14 is still distal to the interface on the mold side, but there is an intervening layer 60.

It is further contemplated that field-induced imprinting can be used in conjunction with other methods of providing imprint pressure such as direct fluid pressure or mechanical pressure in all possible permutations in applying these forces, including applying them simultaneously, sequentially, or selectively.

Figure 7:
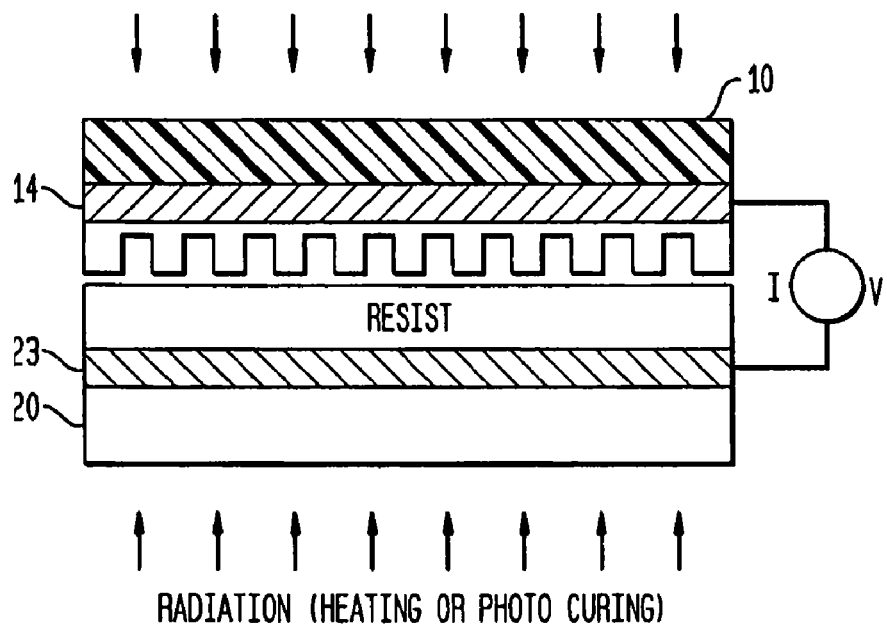
FIG. 7 schematically illustrates how the method of FIG. 1 is compatible with a variety of other processing steps.

FIG. 7 schematically illustrates additional steps compatible with the process described herein. Precision mechanical pressing or pressurized fluid pressing can be of supplemental use, particularly after the molding surface is engaged with the moldable layer. Radiation, such as infrared or ultraviolet, can be used for heating, softening, or curing the moldable surface material. The layers 14, 23 can be conductive or magnetic, and the pressing fields can be DC, AC, or combinations thereof.

It is to be understood that the above described embodiments are illustrative of only a few of the many embodiments which can represent applications of the invention. Numerous and varied other arrangements can be made by those skilled in the art without departing from the spirit and scope of the invention.

The invention claimed is:

1. A method for processing a moldable surface comprising the steps of:
   providing a multilayer substrate having the moldable surface and a first layer of conductive material that is distal to the moldable surface;
   providing a multilayer mold having a molding surface with protruding and recessed features to imprint a pattern, and a second layer of conductive material that is distal to the molding surface;
   pressing the molding surface and the moldable surface together to imprint the molding surface onto the moldable surface;
   withdrawing the mold from the moldable surface; and
   wherein the pressing comprises establishing an electric field between the first and second layers of conductive material distal to the interface between the molding and moldable surfaces to uniformly press together the molding surface and moldable surface by field-induced pressure without unbalanced lateral and rotational forces.

2. The method of claim 1 wherein the moldable surface comprises one or more moldable layers disposed on the substrate.

3. The method of claim 2 wherein the imprinting produces reduced thickness regions in the moldable layer and further comprising the steps of:
   removing the material of the moldable layer from the reduced thickness regions to selectively expose regions of the substrate; and
   further processing the substrate selectively in the exposed regions.

4. The method of claim 3 wherein the further processing comprises doping the substrate with impurities, removing material from the substrate, or adding material on the substrate.

5. The method of claim 1 further comprising the step of hardening the moldable surface after pressing.

6. The method of claim 1 wherein the substrate or the mold or both are sufficiently flexible to conform together during said pressing, independent of deviations from planarity smaller than a tolerance.

7. The method of claim 2 where the thickness of the moldable layer is in the range 0.1 nm to 200 μm.

8. Apparatus for imprinting a moldable surface on a substrate comprising:
- a multilayer mold having a molding surface with protruding and recessed features to imprint a pattern, and a first conductive layer distal to said molding surface;
- a multilayer substrate having a moldable surface positioned adjacent the molding surface of the mold, and a second conductive layer distal to said moldable surface;
- means for uniformly pressing the molding surface and the moldable surface together without unbalanced lateral or rotational forces to imprint the molding surface onto the moldable surface; and
- wherein the means for pressing comprises means for establishing an electric field between the first and second layers of conductive material on opposite sides of the interface between the molding and moldable surfaces.

9. The method of claim 1 wherein providing a mold comprises providing a mold having a molding surface with at least two projecting features spaced apart by less than 200 nanometers.

10. The apparatus of claim 8 wherein the molding surface comprises at least two projecting features spaced apart by less than 200 nanometers.

11. A method for processing a moldable surface comprising the steps of:
- providing a multilayer substrate having the moldable surface and a first layer of magnetic material that is distal to the moldable surface;
- providing a multilayer mold having a molding surface with protruding and recessed features to imprint a pattern, and a second layer of magnetic material that is distal to the molding surface;
- pressing the molding surface and the moldable surface together to imprint the molding surface onto the moldable surface;
- withdrawing the mold from the moldable surface; and
- wherein the pressing comprises establishing a magnetic field between the first and second layers of magnetic material distal to the interface between the molding and moldable surfaces to uniformly press together the molding surface and moldable surface by field-induced pressure without unbalanced lateral and rotational forces.

12. The method of claim 11 wherein said first and second layers of magnetic material are each selected from a set of materials including magnetizable material, permanent magnets, and electromagnets.

13. The method of claim 11 wherein one of said first and second layers of magnetic material is formed by a magnetic field generator, and wherein said magnetic field between the first and second layers of magnetic material is established by energizing said magnetic field generator.

14. The method of claim 11 wherein the substrate or the mold or both are sufficiently flexible to conform together during said pressing, independent of deviations from planarity smaller than a tolerance.

15. Apparatus for imprinting a moldable surface on a substrate comprising:
- a multilayer mold having a molding surface with protruding and recessed features to imprint a pattern, and a first magnetic layer distal to said molding surface;
- a multilayer substrate having a moldable surface positioned adjacent the molding surface of the mold, and a second magnetic layer distal to said moldable surface;
- means for uniformly pressing the molding surface and the moldable surface together without unbalanced lateral or rotational forces to imprint the molding surface onto the moldable surface; and
- wherein the means for pressing comprises means for establishing an attractive magnetic field between the first and second layers of magnetic material on opposite sides of the interface between the molding and moldable surfaces.

16. The apparatus of claim 15 wherein said first and second layers of magnetic material are each selected from a set of materials including magnetizable material, permanent magnets, and electromagnets.

17. The apparatus of claim 15 wherein one of said first and second layers of magnetic material is formed by a magnetic field generator.

18. The apparatus of claim 15 wherein the multilayer substrate or the multilayer mold or both are sufficiently flexible to conform together under uniform pressure, independent of deviations from planarity small than a tolerance.

19. The apparatus of claim 8 wherein the multilayer substrate or the multilayer mold or both are sufficiently flexible to conform together under uniform pressure, independent of deviations from planarity smaller than a tolerance.

* * * * *